United States Patent
Takahashi et al.

(10) Patent No.: US 7,462,540 B2
(45) Date of Patent: Dec. 9, 2008

(54) SILICON CARBIDE SEMICONDUCTOR DEVICE AND PROCESS FOR PRODUCING THE SAME

(75) Inventors: Kunimasa Takahashi, Osaka (JP); Makoto Kitabatake, Nara (JP); Kenya Yamashita, Osaka (JP); Masao Uchida, Osaka (JP); Osamu Kusumoto, Nara (JP); Ryoko Miyanaga, Nara (JP)

(73) Assignee: Panasonic Corporation, Osaka (JP)

( * ) Notice: Subject to any disclaimer, the term of this patent is extended or adjusted under 35 U.S.C. 154(b) by 495 days.

(21) Appl. No.: 10/553,845

(22) PCT Filed: Jan. 28, 2005

(86) PCT No.: PCT/JP2005/001240

§ 371 (c)(1),
(2), (4) Date: Oct. 20, 2005

(87) PCT Pub. No.: WO2005/076327

PCT Pub. Date: Aug. 18, 2005

(65) Prior Publication Data

US 2006/0220027 A1    Oct. 5, 2006

(30) Foreign Application Priority Data

Feb. 6, 2004    (JP)    ............... 2004-030972

(51) Int. Cl.
H01L 21/00    (2006.01)

(52) U.S. Cl. ............... 438/268; 438/570; 438/758

(58) Field of Classification Search ............... 438/268, 438/570, 758
See application file for complete search history.

(56) References Cited

U.S. PATENT DOCUMENTS

| 5,219,798 | A | * | 6/1993 | Kamakura | ............ 438/530 |
| 5,719,410 | A | * | 2/1998 | Suehiro et al. | ............ 257/77 |
| 6,054,352 | A | * | 4/2000 | Ueno | ............ 438/268 |
| 6,096,607 | A | * | 8/2000 | Ueno | ............ 438/268 |
| 6,100,193 | A | * | 8/2000 | Suehiro et al. | ............ 438/685 |
| 6,117,735 | A | * | 9/2000 | Ueno | ............ 438/268 |
| 6,133,120 | A | * | 10/2000 | Miyajima et al. | ............ 438/478 |

(Continued)

FOREIGN PATENT DOCUMENTS

CN    1414605 A    4/2003

(Continued)

OTHER PUBLICATIONS

Chinese Office Action, with English translation, issued in Chinese Patent Application No. CN 200580003598, mailed Jan. 4, 2008.

*Primary Examiner*—Laura M Menz
(74) *Attorney, Agent, or Firm*—McDermott Will & Emery LLP (57) ABSTRACT

A method for fabricating a semiconductor device includes the steps of implanting ions into a silicon carbide thin film (2) formed on a silicon carbide substrate (1), heating the silicon carbide substrate in a reduced pressure atmosphere to form a carbon layer (5) on the surface of the silicon carbide substrate, and performing activation annealing with respect to the silicon carbide substrate in an atmosphere under a pressure higher than in the step of forming the carbon layer (5) and at a temperature higher than in the step of forming the carbon layer (5).

9 Claims, 9 Drawing Sheets

U.S. PATENT DOCUMENTS

| | | | |
|---|---|---|---|
| 6,238,980 B1 * | 5/2001 | Ueno | 438/268 |
| 6,294,444 B1 * | 9/2001 | Ueno | 438/514 |
| 6,465,807 B1 * | 10/2002 | Ueno | 257/77 |
| 6,573,534 B1 * | 6/2003 | Kumar et al. | 257/77 |
| 7,189,624 B2 * | 3/2007 | Ito | 438/308 |
| 7,195,996 B2 * | 3/2007 | Arai et al. | 438/570 |
| 2003/0080384 A1 | 5/2003 | Takahashi et al. | |
| 2005/0023577 A1 * | 2/2005 | Ito | 257/288 |
| 2006/0151806 A1 * | 7/2006 | Fukuda et al. | 257/155 |
| 2006/0220027 A1 * | 10/2006 | Takahashi et al. | 257/77 |
| 2007/0037369 A1 * | 2/2007 | Arai et al. | 438/570 |
| 2007/0138567 A1 * | 6/2007 | Ito | 257/369 |
| 2007/0167026 A1 * | 7/2007 | Miura | 438/758 |
| 2008/0090383 A1 * | 4/2008 | Nakamura et al. | 438/465 |

FOREIGN PATENT DOCUMENTS

| | | |
|---|---|---|
| JP | 2000-012482 | 1/2000 |
| JP | 2002-012482 | 1/2000 |
| JP | 2001-068428 | 3/2001 |
| JP | 2001068428 A * | 3/2001 |
| JP | 2002-016013 | 1/2002 |
| JP | 2002-184714 | 6/2002 |
| JP | 2002-089551 | 10/2002 |
| JP | 2002-314071 | 10/2002 |

* cited by examiner

SILICON CARBIDE SEMICONDUCTOR DEVICE AND PROCESS FOR PRODUCING THE SAME

This application is the U.S. National Phase under 35 U.S.C. § 371 of International Application No. PCT/JP2005/001240, filed Jan. 28, 2005, which in turn claims the benefit of Japanese Application No. 2004-030972, filed Feb. 6, 2004, the disclosures of which Applications are incorporated by reference herein in their entirety.

TECHNICAL FIELD

The present invention relates to a semiconductor device using a silicon carbide substrate and to a method for fabricating the same.

BACKGROUND ART

Silicon carbide (SiC) is a semiconductor material the application of which to a next-generation low-loss power device or the like is expected because it features a larger band gap than silicon (Si) and a higher field intensity at which a dielectric breakdown occurs. Silicon carbide has numerous polytypes including cubic-type 3C—SiC and hexagonal-type 6H—SiC and 4H—SiC. Of these polytypes, 6H—SiC and 4H—SiC are used commonly to produce practically usable silicon carbide semiconductor devices. Among them, a silicon carbide substrate (SiC substrate) having a principal surface which is substantially coincident with the (0001) plane perpendicular to the crystal axis of the c-axis is used mostly for a silicon carbide semiconductor device (SiC semiconductor device).

To form a silicon carbide semiconductor device, it is necessary to form an epitaxially grown layer serving as the active region of the semiconductor device on a silicon carbide substrate and control the conductivity type and carrier concentration of a selected region in the epitaxially grown layer. To form an impurity doped layer in the selected local region, a technology which ion-implants an impurity dopant into the epitaxially grown layer is used.

A description will be given herein below to a typical method for forming a MOSFET made of silicon carbide by using the ion implantation technology.

FIGS. 9(a) to 9(d) are cross-sectional views illustrating the typical method for forming the MOSFET made of silicon carbide.

Figure 9A:
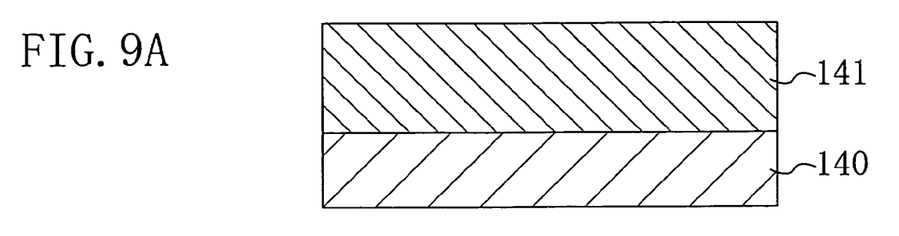
FIGS. 9(a) to 9(d) are cross-sectional views illustrating a typical method for forming a MOSFET made of silicon carbide.

First, in the step shown in FIG. 9(a), a silicon carbide thin film is epitaxially grown on a silicon carbide substrate 140 to form an n-type drift layer 141. In this step, the density of steps in the surface of the substrate is increased by intentionally imparting a slight angle (at several degrees) to the (0001) plane of the silicon carbide substrate 140 so that the silicon carbide thin film is grown by a step flow process which involves the lateral growth of the steps. At present, it is common practice to impart an off-angle of 8° to 4H—SiC and an off-angle of 3.5° to 6H—SiC, each in the [11-20] direction by using the (0001) plane as a reference plane.

Figure 9B:
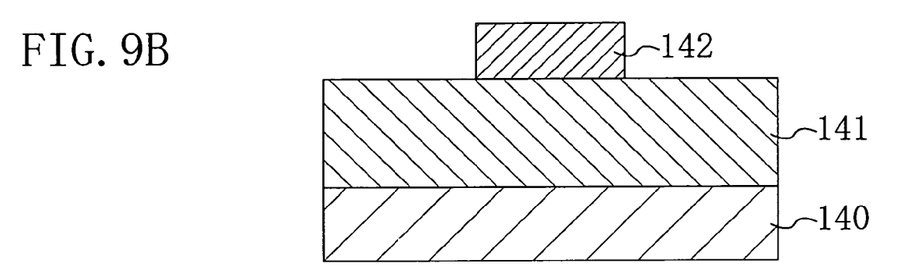

Subsequently, in the step shown in FIG. 9(b), an implant mask 142 for ion implantation is formed on the upper surface of the n-type drift layer 141. The implant mask 142 covers a portion of the n-type drift layer 141 such that a region, which will serve as a p-type well region 143 in the subsequent step, is opened.

Figure 9C:
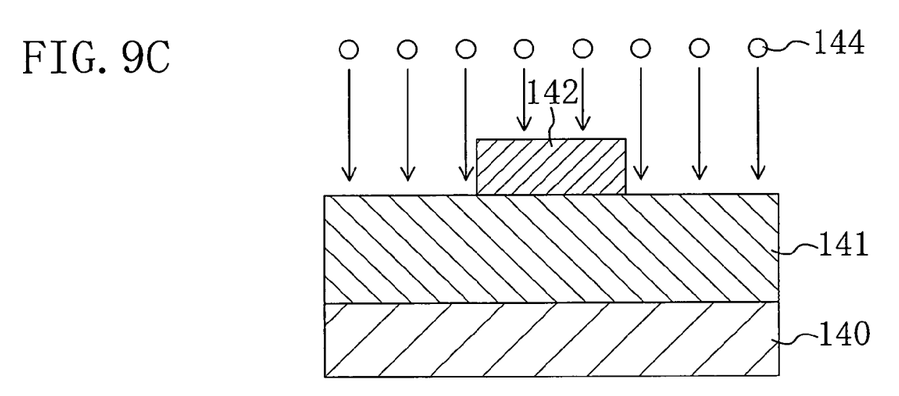

Next, in the step shown in FIG. 9(c), Al ions 144 are implanted into the n-type drift layer 141 from above the implant mask 142.

Figure 9D:
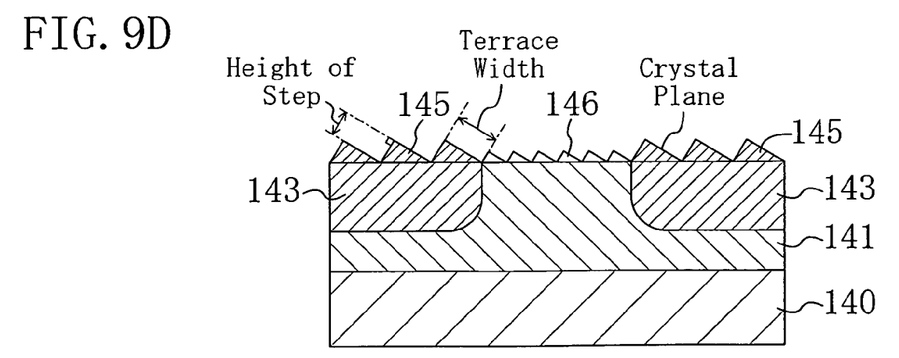

Then, in the step shown in FIG. 9(d), the implant mask 142 is removed. Thereafter, an activation annealing process is performed by heating the silicon carbide substrate 140 in an inert gas (e.g., argon gas) atmosphere to a temperature not lower than 1700° C. to recover the damage caused by the ion implantation and activate the implanted impurity ions. By the activation annealing process, a p-type well region 143 is formed in a part of the n-type drift layer 141.

By subsequently performing additional ion implantation and the formation of electrodes, a vertical MOSFET can be fabricated.

However, since the silicon carbide substrate is processed at a high temperature in the step shown in FIG. 9(d), macro-steps 145 are formed disadvantageously in the upper surface of the region into which the ions have been implanted. In addition, macro-steps 146 are also formed in the upper surface of the region into which ions have not been implanted, though the macro-steps 146 are smaller in size than the macro-steps 145 in the ion implanted region. A macro-step is a bunch of combined steps each formed at a depth corresponding to several atomic layers in the surface of a silicon carbide thin film. In a prior art technology as shown in FIGS. 9, projections and depressions formed due to the macro-steps in the upper surface of the silicon carbide thin film after the activation annealing have presented a great obstacle to an improvement in the performance of the semiconductor device. A conceivable reason for the macro-steps 145 formed in the ion implanted region which are larger in size than the macro-steps 146 formed in the region without ion implantation is that the damage caused by the ion implantation has rendered silicon atoms and carbon atoms more likely to be desorbed from the surface of the silicon carbide thin film. The size of each of the macro-steps 145 is larger as the temperature for the activation annealing is higher. There are cases where a step height (see FIG. 9(d)) reaches several tens of nanometers and the width of a terrace reaches several hundreds of nanometers.

The formation of the macro-steps has caused performance degradation in numerous semiconductor devices including a MOSFET. In the case with, e.g., a Schottky diode, the problem is encountered that the localization of an electric field to the tip portions of macro-steps occurs in a Schottky electrode formed on the upper surface of a silicon carbide thin film and the breakdown voltage thereof is thereby lowered. In the case with a MESFET in which a current flows in the surface layer of a silicon carbide thin film, the problem is encountered that the disturbance of carriers occurs in macro-steps to lower mobility and reduce transconductance. A MOSFET in which a gate oxide film is formed by thermal oxidation on the upper surface of a silicon carbide thin film encounters the problem that the formation of an oxide film having different thicknesses at the sidewall and terrace portions of macro-steps causes the non-uniform thickness of an inversion layer formed by applying a gate voltage and the lowering of channel mobility. Thus, in accordance with the conventional method, even when a semiconductor device is produced by using silicon carbide, it has been difficult to obtain electric characteristics expected from the inherently excellent physical property values of silicon carbide.

To prevent the steps from being formed in the upper surface of a silicon carbide thin film by activation annealing, it has been proposed to form a diamond-like carbon (DLC) film or a photoresist as a protective film on the upper surface of the silicon carbide thin film prior to the activation annealing (see, e.g., Patent Document 1).

Patent Document 1: Japanese Laid-Open Patent Publication No. 2001-68428

DISCLOSURE OF THE INVENTION

Problems to be Solved by the Invention

However, a conventional silicon carbide semiconductor device and a method for fabricating the same as disclosed in Patent Document 1 has had the following problems.

Since the diamond-like carbon film or the photoresist is formed as the protective film on the upper surface of the silicon carbide thin film, the problem is encountered that the number of the fabrication steps for a semiconductor device is increased disadvantageously. Depending on the structure of the semiconductor device, it is necessary to perform a plurality of steps of activation annealing and the conventional method has necessitated the formation of the protective film in each step of activation annealing. In addition, a new apparatus is required to form such a protective film, which increases fabrication cost. Moreover, the problem is also encountered that the step of removing the protective film after the activation annealing and an apparatus for removing the protective film become necessary.

In addition to these problems, there is also the possibility that, when the activation annealing is performed at a high temperature not lower than 1600° C., an impurity material in the protective film may be diff-used into the silicon carbide thin film or the impurity material sublimated from the protective film contaminates the inside of an annealing furnace. When contamination by such an impurity occurs, the characteristics of a silicon carbide semiconductor device are degraded significantly.

Thus, even though the formation of step bunching can be suppressed by such countermeasures, it has been extremely difficult to form a silicon carbide semiconductor device having excellent characteristics. Accordingly, there have been demands for a silicon carbide semiconductor device in which projections and depressions are not formed in the surface by activation annealing and the characteristics are not degraded by an impurity material and a fabrication method therefor.

In view of the foregoing problems, an object of the present invention is to provide a method for fabricating a silicon carbide semiconductor device which allows the upper surface of a silicon carbide thin film to retain flatness, while increasing the activation ratio of the implanted impurity, and a silicon carbide semiconductor device fabricated by the method.

Means for Solving the Problems

To solve the foregoing problems, a method for fabricating a silicon carbide semiconductor device according to the present invention comprises the steps of: (a) implanting impurity ions into a silicon carbide layer (including a silicon carbide substrate and a silicon carbide film grown epitaxially on a silicon carbide substrate); (b) heating the silicon carbide layer to form a carbon layer on a surface of the silicon carbide layer; and (c) after the step (b), performing an activation annealing process with respect to the silicon carbide layer in an atmosphere at a temperature higher than in the step (b).

Since the method allows the activation annealing process in the step (c) to be performed in the state in which the carbon layer has been formed, macro-steps formed in the surface of the ion implanted region can be reduced in size even when the activation annealing is performed at a high temperature. As a result, it becomes possible to produce a semiconductor device in which the upper surface of the silicon carbide substrate or the silicon carbide film is more flat than in the conventional embodiment without lowering the activation ratio of the impurity implanted in the silicon carbide substrate or the silicon carbide film. By the method according to the present invention, the contamination of the semiconductor device with an impurity material such as the component of a resist film can particularly be prevented because the carbon layer serving as a protective film is generated from the silicon carbide substrate or the silicon carbide film.

The step (b) includes forming the carbon layer under a pressure condition lower than an atmospheric pressure and the step (c) includes performing the activation annealing process under a pressure condition higher than in the step (b). The arrangement promotes the sublimation of silicon from the surface of the silicon carbide substrate or the silicon carbide film in the step (b) and thereby allows the carbon layer to be formed more promptly than in the case where the step (b) is performed under the same pressure condition as in the step (c).

Preferably, the steps (b) and (c) are performed in the same heating furnace. The arrangement allows a reduction in the types of the apparatus to be used and the simplification of the process steps.

The step (b) includes forming the carbon layer in the presence of a gas containing hydrogen. The arrangement is preferred since it promotes the formation of the carbon layer.

Preferably, the step (b) includes forming the carbon layer under a pressure condition not lower than $1 \times 10^{-5}$ Pa and not higher than 10 Pa. This is because, when the pressure is higher than 10 Pa, steps are formed disadvantageously by the heating process in the upper surface of the silicon carbide substrate or the silicon carbide film and, when the pressure is lower than $10^{-5}$ Pa, even carbon may be sublimated undesirably by the heating process.

Preferably, a temperature of the silicon carbide layer is not lower than 1100° C. and not higher than 1400° C. in the step (b). This is because, when the substrate temperature is lower than 1100° C., the sublimation of silicon from the substrate surface does not occur and, when the substrate temperature is higher than 1400° C., even carbon may be sublimated undesirably.

Preferably, the step (c) includes performing the activation annealing process by adjusting a temperature of the silicon carbide layer to a range not lower than 1500° C. and not higher than 2000° C. under a pressure condition not lower than 1 kPa and not higher than 100 kPa. This is because, by performing the activation annealing in this pressure range and this temperature range, the activation ratio of the impurity can be increased sufficiently.

The method further comprises the step of: (d) after the step (c), heating the silicon carbide layer in the presence of a gas containing oxygen atoms to remove the carbon layer. The arrangement causes the carbon film to react with oxygen molecules and thereby allows the removal of the carbon film.

If a temperature of the silicon carbide layer is not lower than 500° C. and not higher than 1000° C. in the step (d), the carbon layer can be removed more reliably. In particular, the substrate temperature is adjusted preferably to 800° C. The arrangement allows more efficient removal of the carbon layer without causing the oxidation reaction of silicon carbide.

The removal of the carbon layer in the step (d) is performed in the same heating furnace as the activation annealing process in the step (c). The arrangement allows a reduction in the types of the apparatus to be used and the simplification of the process steps.

A silicon carbide semiconductor device according to the present embodiment comprises: a silicon carbide layer; an impurity doped layer formed in a part of the silicon carbide layer; and an electrode provided on the silicon carbide layer, wherein a step height at an upper surface of the silicon carbide layer is substantially the same in the impurity doped layer and in a region of the silicon carbide layer other than the impurity doped layer. In the present specification and the scope of claims, a "step height" indicates a value obtained by dividing the sum of the heights of all steps in a 10-μm square region on the surface of the silicon carbide layer by the number of the steps, while the "height of a step" indicates the height difference between the crystal planes of two adjacent steps (the height difference in a direction perpendicular to the crystal planes), as shown in FIG. 9(d). An impurity doped layer according to the present invention is exposed at a part of the upper surface of a silicon carbide layer.

The achievement of substantially the same step height in the impurity doped layer of the silicon carbide layer and the region thereof other than the impurity doped layer is enabled by the method for fabricating a silicon carbide semiconductor device according to the present invention. That is, by generating the carbon layer from the silicon carbide layer such that it is located on the upper surface thereof, bonds are strong at the interface between the carbon layer and the silicon carbide layer so that, even when annealing for activating the impurity is performed, the formation of macro-steps in the upper surface of the silicon carbide layer is suppressed. In contrast to a conventional embodiment in which macro-steps are formed in an impurity doped layer to be larger than in the other region, the present invention allows the impurity doped layer and the other region to be protected by the carbon layer which is coupled with strong bonds to the silicon carbide layer so that the step height is substantially the same in either of the regions.

In the silicon carbide semiconductor device according to the present invention, the mobility of carriers can be improved in the case where, e.g., a current flows in the vicinity of the upper surface of the impurity doped layer. Otherwise, it is also possible to reduce the localization of an electric field and increase the breakdown voltage in the case where a Schottky electrode is provided on the impurity doped layer.

Preferably, the step height at the upper surface of the silicon carbide layer is not less than 0.1 nm and not more than 1 nm. In this case, in particular, a silicon carbide semiconductor device can be implemented which features a high breakdown voltage and allows a current to flow with high-density.

To form the carbon layer from the silicon carbide layer in the step of forming the silicon carbide semiconductor device according to the present invention, a concentration of an element in the impurity doped layer other than carbon, silicon, and a dopant of the impurity doped layer is held at a value not higher than $1 \times 10^{14}$ cm$^{-3}$. In the conventional embodiment, when a diamond-like carbon film or a photoresist is used as the protective film, there is the possibility that the impurity contained in the protective film may be diff-used into a silicon carbide layer to degrade the characteristics of the silicon carbide semiconductor device. By contrast, the present invention uses carbon originally contained in the silicon carbide layer so that the characteristics of the silicon carbide semiconductor device are prevented from degradation.

Although diamond-like carbon is made of carbon, there is the possibility that an impurity such as chromium, nickel, iron, or manganese in a SUS chamber may be mixed in diamond-like carbon during the formation thereof by plasma CVD. When diamond-like carbon is used for the protective film, the impurity may enter the silicon carbide layer.

On the other hand, a resist is made of carbon, hydrogen, and oxygen. When the resist is used as the protective film, there is the possibility that these elements may be diffused into the silicon carbide layer.

From the foregoing, it will be understood that the concentrations of impurities contained in diamond-like carbon or a resist are lower in the silicon carbide semiconductor device according to the present invention than in the conventional embodiment. Specifically, the concentrations of hydrogen, oxygen, chromium, nickel, manganese, and iron are lower.

The silicon carbide semiconductor device according to the present invention may further comprise: a gate insulating film provided on the silicon carbide layer; a gate electrode provided on the gate insulating film; and a first electrode in ohmic contact with the silicon carbide layer. In this case, since the gate insulating film is allowed to have a more uniform thickness than in the conventional embodiment, the gate breakdown voltage can be increased.

Alternatively, the silicon carbide semiconductor device according to the present invention may further comprise: a silicon carbide substrate provided on a lower surface of the silicon carbide layer; and a second electrode in ohmic contact with a lower surface of the silicon carbide substrate. In this case, the characteristics of a device in which a current flows vertically such as, e.g., a vertical MOSFET can be improved.

Alternatively, the silicon carbide semiconductor device according to the present invention may further comprise: a third electrode in Schottky contact with the silicon carbide layer. In this case, since a Schottky barrier can be formed excellently between the silicon carbide film and the second electrode, the semiconductor device with an increased breakdown voltage can be implemented.

Effect of the Invention

Thus, the method for fabricating the semiconductor device according to the present invention allows a silicon carbide semiconductor device which realizes a high activation ratio to be provided, while allowing a silicon carbide semiconductor film to retain a flat surface.

DESCRIPTION OF NUMERALS

1 Silicon Carbide Substrate
2 Silicon Carbide Thin Film
3 Impurity Ions
4 Impurity Ion Implanted Layer
5, 25 Carbon Layer
6 Impurity Doped Layer
21 Silicon Carbide Substrate
22 n-Type Drift Layer
23 First Impurity Ion Implanted Layer
24 Second Impurity Ion Implanted layer
26 p-Type Well Region
27 Contact Region for Source
28 Gate Insulating Film
29 Source Electrode
30 Drain Electrode
31 Gate Electrode
150 Reaction Furnace
151 Substrate
152 Susceptor
153 Support Shaft
154 Coil
155 Argon Gas
156 Hydrogen Gas
157 Oxygen Gas
158 Gas Supply System
159 Gas Exhaust System
160 Piping for Exhaust Gas
161 Pressure Adjustment Valve
162 Heat Insulating Material

BEST MODE FOR CARRYING OUT THE INVENTION

Embodiment 1

A method for fabricating a semiconductor device according to a first embodiment of the present invention is characterized in that a carbon layer is formed on a substrate surface by performing annealing in a reduced pressure atmosphere before an activation annealing process after ion implantation and then the activation annealing is performed continuously by raising a pressure and a temperature. Referring to the drawings, the semiconductor device and the method for fabricating the same according to the first embodiment will be described herein below.

Figure 10:
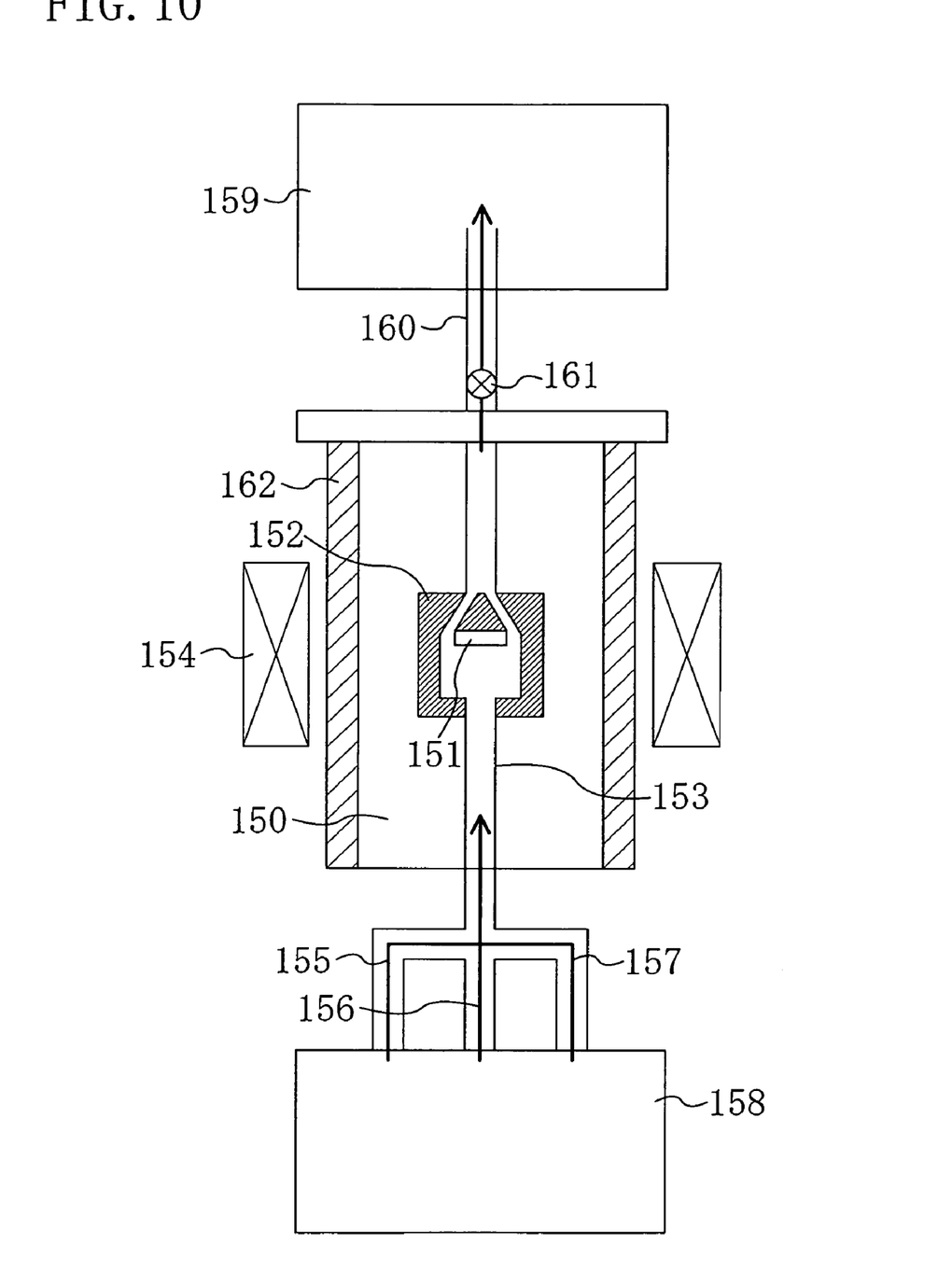
FIG. 10 is a cross-sectional view showing the structure of an annealing furnace used in the method for fabricating a semiconductor device according to the present invention.

FIG. 10 is a cross-sectional view showing the structure of an annealing furnace used in the method for fabricating the semiconductor device according to the present invention. As shown in the drawing, the annealing furnace comprises: a reaction furnace 150; a susceptor 152 made of carbon which is for fixing a substrate 151; a support shaft 153; a coil 154 for heating a sample; a gas supply system 158 for supplying an argon gas 155, a hydrogen gas 156; and an oxygen gas 157 to the reaction furnace 150; a gas exhaust system 159 for exhausting the gasses in the reaction furnace 150 therefrom; piping 160 for exhaust gases; and a pressure adjustment valve 161. The susceptor 152 is covered with a heat insulating material 162 from therearound. The susceptor 152 supported by the support shaft 153 is heated by RF induction heating using the coil 154 wound around the reaction furnace 150.

A description will be given to the method for fabricating the semiconductor device which forms a carbon layer on a silicon carbide substrate after ion implantation by using the annealing furnace and performs activation annealing thereafter.

FIGS. 1(a) to 1(d) are cross-sectional views illustrating the method for fabricating the semiconductor device according to the first embodiment.

Figure 1A:
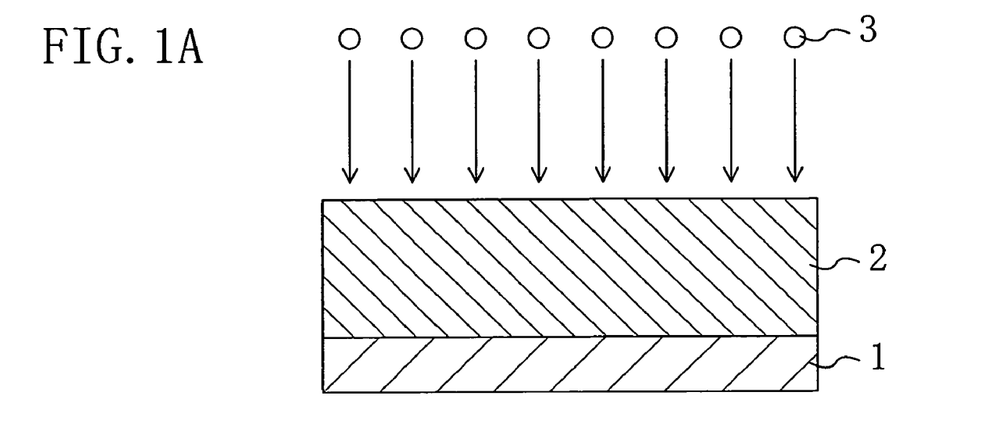
FIGS. 1(a) to 1(d) are cross-sectional views illustrating the step of forming an impurity doped layer by ion implantation in a method for fabricating a semiconductor device according to a first embodiment of the present invention.

First, in the step shown in FIG. 1(a), a silicon carbide substrate 1 at an off-angle of 8 degrees in the [11-20] (112-bar 0) direction and with a diameter of 50 mm is prepared. As the silicon carbide substrate 1, an n-type 4H—SiC substrate, e.g., is used. Then, a silicon carbide thin film (silicon carbide film) 2 with a thickness of 10 μm is epitaxially grown by CVD on the silicon carbide substrate 1. Subsequently, impurity ions 3 are implanted into the silicon carbide thin film 2 by using an ion implantation apparatus, whereby an impurity ion implanted layer 4 is formed (see FIG. 1(b)). As the impurity ions 3 to be implanted herein, aluminum ions for forming, e.g., a p-type doped layer are selected. Specifically, the aluminum ions are implanted in multiple stages at seven acceleration voltages. At this time, the ions are individually implanted at a dose of $3 \times 10^{14}$ cm$^{-3}$ by adjusting the acceleration voltage to 1.0 MeV, 1.6 MeV, and 2.4 MeV, at a dose of $7 \times 10^{14}$ cm$^{-3}$ by adjusting the acceleration voltage to 3.3 MeV and 4.4 MeV, and at a dose of $3 \times 10^{14}$ cm$^{-3}$ by adjusting the acceleration voltage to 5.6 MeV and 7.0 MeV. The substrate temperature during the ion implantation is adjusted to a room temperature. As a result, the impurity ion implanted layer 4 at a mean dopant concentration of about $5 \times 10^{18}$ cm$^{-3}$ and with a thickness of 4 μm is formed.

Subsequently, in the step shown in FIG. 1(b), the silicon carbide substrate 1 formed with the impurity ion implanted layer 4 is placed on a susceptor 152 in the annealing furnace and then a chamber is internally evacuated by using the gas exhaust system 159. At this time, the degree of vacuum (atmospheric pressure in the chamber) is adjusted to about $10^{-4}$ Pa. In the state in which the chamber has been internally evacuated, an RF power of 20.0 kHz and 20 kW is applied to the coil for induction heating, thereby heating the silicon carbide substrate 1 to 1250° C. In this state, annealing is performed for 60 minutes. At this time, a hydrogen gas may also be supplied, while maintaining a low pressure in the furnace. In this case, the presence of hydrogen allows easy debonding between silicon and carbon and facilitates selective sublimation of silicon.

Figure 2:
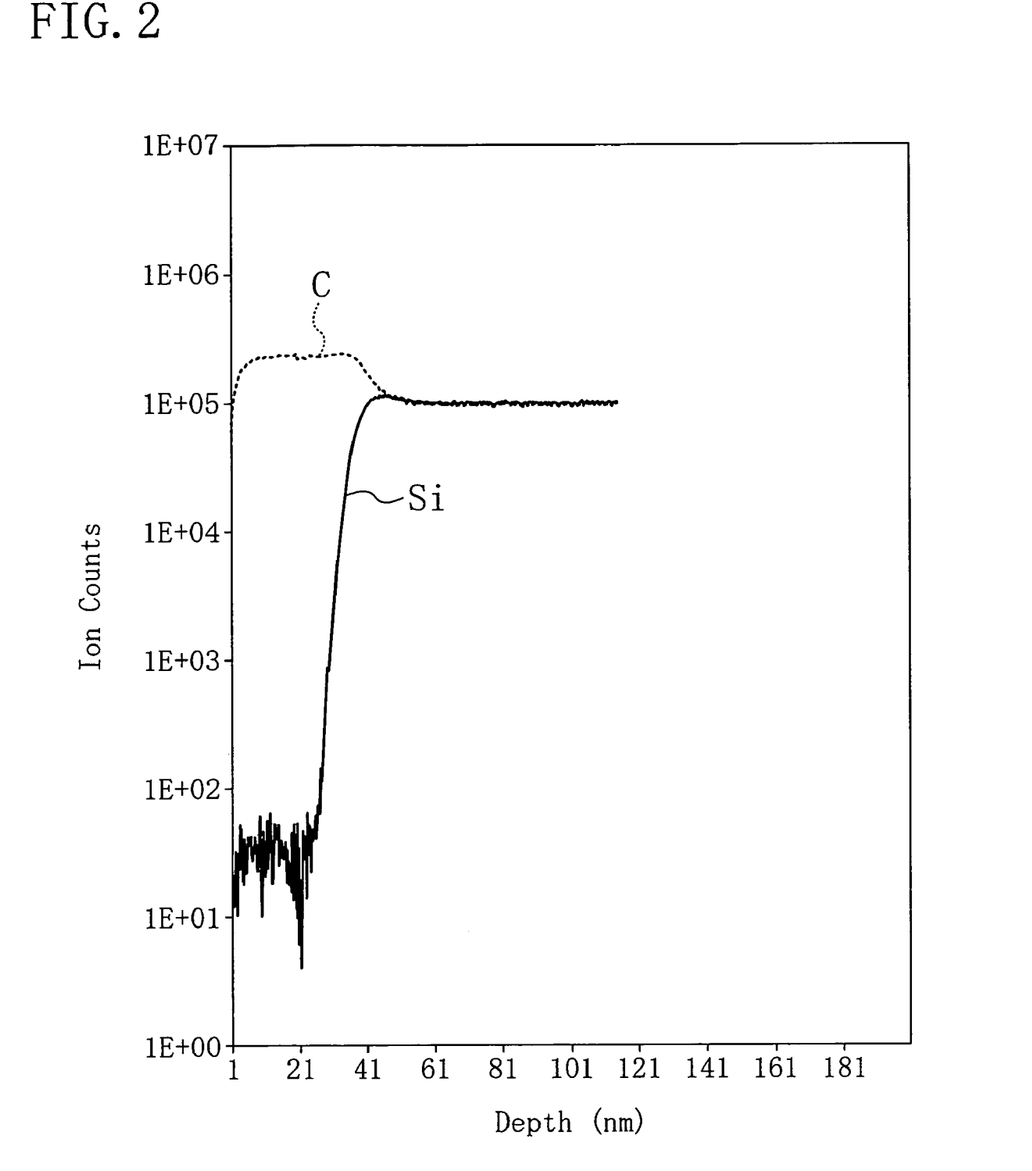
FIG. 2 is a view showing the result of analyzing a substrate after activation annealing by using a secondary ion mass spectroscope (SIMS)

FIG. 2 is a view showing the result of analyzing the substrate after activation annealing by using a secondary ion mass spectroscope (SIMS). As shown in the drawing, the result of the compositional analysis of the upper portion of the substrate shows that the carbon layer 5 with a thickness of about 30 nm has been formed on the substrate surface, i.e., on the impurity ion implanted layer 4.

Figure 1B:
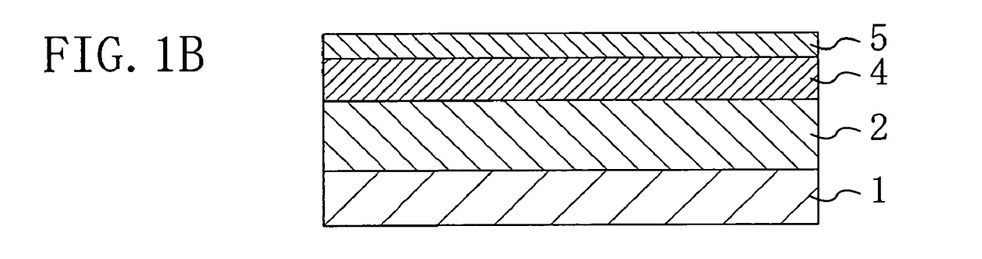
Figure 1C:
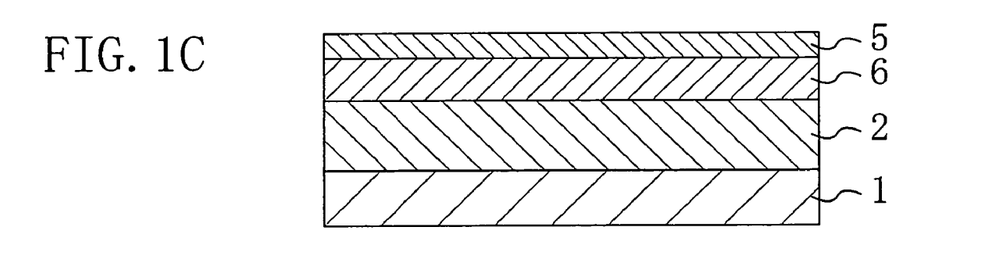

Next, in the step shown in FIG. 1(c), a gas for annealing atmosphere (annealing gas) is supplied from the gas supply system 158, while the silicon carbide substrate 1 having the carbon layer 5 formed on the surface thereof remains heated at 1250° C. As the annealing gas, an argon gas 155 is selected and the flow rate of the gas is adjusted to 0.5 liters/minute. Then, the pressure in the chamber is increased by using the pressure adjustment valve 161 to be held constant at 91 kPa. Thereafter, the substrate temperature is raised to 1750° C. and activation annealing is performed for 30 minutes, while the temperature is maintained. Then, heating is terminated by halting the application of the RF power to the coil 154, while the argon gas 155 is supplied continuously, so that the substrate 151 is cooled. By the activation annealing process, the aluminum ions in the impurity ion implanted layer 4 are activated so that the impurity doped layer 6 is formed in the silicon carbide thin film 2.

Subsequently, in the step shown in FIG. 1(d), the substrate temperature in the chamber of the annealing furnace is held constant at 800° C. for the removal of the carbon layer 5 and oxygen at a flow rate of 5 liters/minute is supplied so that a heating process is performed for 30 minutes. By this process, the carbon layer 5 as a substrate surface layer is completely removed and the impurity doped layer 6 is exposed.

After this step, by passing through the steps including, e.g., the formation of an electrode on the impurity doped layer 6, various semiconductor devices such as a MOSFET can be produced.

Figure 1D:
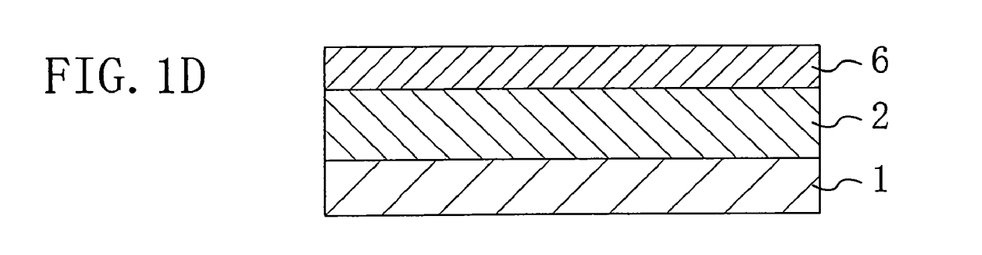
Figure 3:
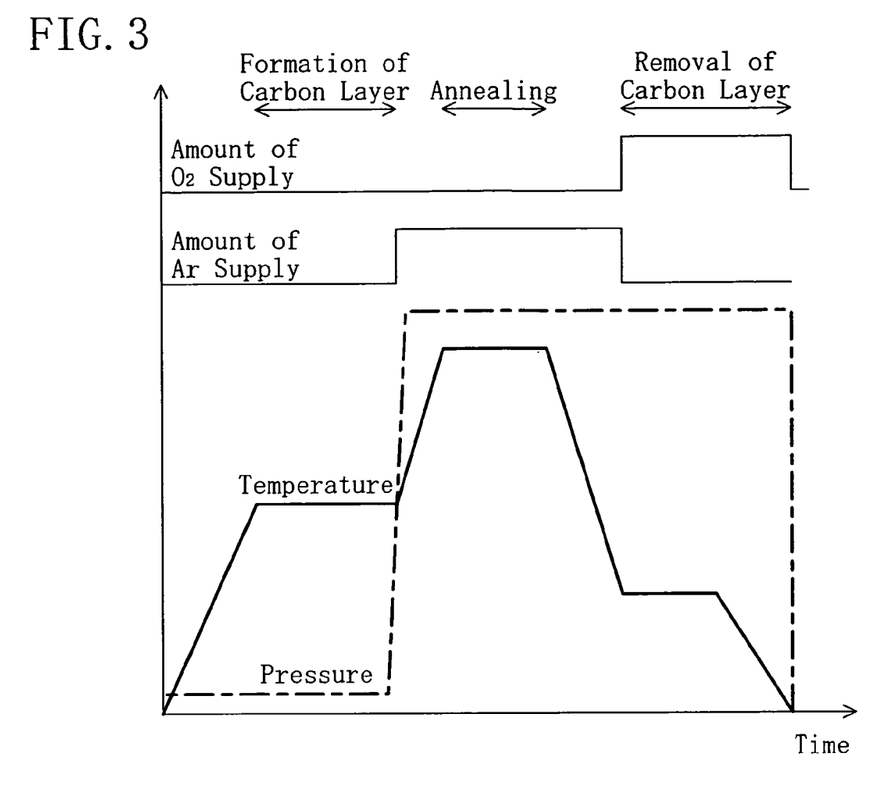
FIG. 3 is a timing chart showing a substrate temperature, a pressure in a heating furnace, and an amount of gas supply which vary with time in the step illustrated in FIGS. 1(b) to 1(d)

FIG. 3 is a timing chart showing a substrate temperature, a pressure in the heating furnace, and an amount of gas supply which vary with time in the steps illustrated in FIGS. 1(b) to 1(d).

Figure 4:
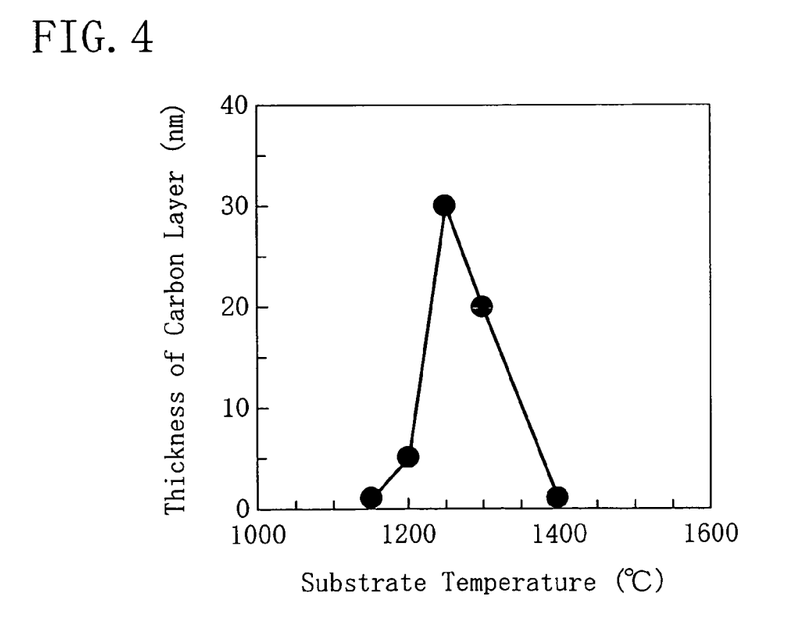
FIG. 4 is a graph showing the relationship between the thickness of a carbon layer formed in FIG. 1(b) and the substrate temperature.

As shown in the drawing, in the step of forming the carbon layer 5 shown in FIG. 1(b), the pressure in the heating furnace is held at a value at least under an atmospheric pressure, preferably at a value not lower than $10^{-5}$ Pa and not higher than 10 Pa and the substrate temperature is adjusted to a level not lower than 1100° C. and not higher than 1400° C., which is lower than the activation annealing temperature. FIG. 4 is a graph showing the relationship between the thickness of the carbon layer formed in FIG. 1(b) and the substrate temperature. From FIG. 4, it will be understood that the carbon layer has been formed when the substrate temperature is not lower than 1100° C. and not higher than 1400° C. This is because the sublimation of silicon (Si) does not occur when the substrate temperature is lower than 1100° C. and even carbon (C) is sublimated undesirably when the substrate temperature is higher than 1400° C. That is, since Si is sublimated at a temperature lower than C, Si is selectively sublimated from the impurity ion implanted layer 4 by thus limiting the temperature range so that only C remains in the substrate surface to consequently form the carbon layer 5. The adjustment of the pressure in the furnace to a value lower than the atmospheric pressure is for promoting the sublimation of Si. However, since even C is sublimated by the heating process when the pressure in the furnace becomes lower than $10^{-5}$ Pa and steps are formed disadvantageously in the substrate surface when the pressure in the furnace exceeds 10 Pa, the process is performed preferably within the foregoing pressure range. The formation of the carbon layer 5 is possible provided that the substrate temperature is set in the above-mentioned range.

Subsequently, in the activation annealing step shown in FIG. 1(c), the pressure in the heating furnace is maintained at a level at least higher than in the step of forming the carbon layer 5, preferably at a level not lower than 1 kPa and not higher than 100 kPa, by supplying an argon gas and the substrate temperature is adjusted to be not lower than 1500° C. and not higher than 2000° C. Since the activation ratio of the impurity is generally proportional to the substrate temperature, the activation ratio in the impurity doped layer 6 can be adjusted to 80% or higher by increasing the substrate temperature to a level higher than in the step of forming the carbon layer 5 within the range in which the speed of sublimation of silicon carbide is not high. In the present specification, the "activation ratio" used herein indicates a value obtained by dividing the concentration of carriers contained in the impurity doped layer by the concentration (density) of the implanted impurity. The concentration of carriers can be calculated from an amount of current per unit area. The concentration (density) of the implanted impurity can be measured by SIMS or the like.

Then, after the supply of the argon gas is halted, an oxygen gas is supplied in the step shown in FIG. 1(d) in the state in which the substrate temperature has been adjusted to be not lower than 500° C. and not higher than 1000° C. In this step, the carbon layer 5 can be removed by effectively causing a reaction between oxygen and the carbon layer 5 provided that the substrate temperature is not lower than 500° C. and not higher than 1000° C. However, the most preferred substrate temperature is 800° C. since it allows the carbon layer 5 to be removed without causing the oxidation reaction of silicon carbide. The carbon layer can also be removed if a gas containing oxygen molecules is supplied instead of the oxygen gas.

Then, the present inventors analyzed the surface morphology of the substrate to which the activation annealing had been performed in accordance with the method described above by using an atomic force microscope (AFM). For the sake of comparison, another silicon carbide substrate was prepared by implanting impurity ions thereinto under the same conditions as in the method according to the present embodiment and performing the prior-art activation annealing in an argon gas atmosphere with respect thereto. The conditions for the prior-art activation annealing were such that the substrate temperature was 1750° C, the flow rate of an argon gas was 0.5 liters/minute, the pressure in the furnace during the annealing was held constant at 91 kPa, and the annealing time was 30 minutes. Measurement for the surface morphology of the substrate to which the activation annealing had been performed in accordance with the conventional method was also conducted by using the AFM.

As a result of making a comparison between the respective surface morphologies resulting from the activation annealing in accordance with the method of the present embodiment and from the prior-art activation annealing, it was proved that the activation annealing in accordance with the method of the present embodiment had achieved a two-order-of-magnitude reduction in the surface roughness of the substrate compared with the conventional method. The surface roughness of the upper surface of the substrate processed in accordance with the method of the present embodiment was about 0.5 nm. The "surface roughness" mentioned herein has the same meaning as the step height. As a result of examining the activation ratio of aluminum ions in the substrate processed in accordance with the method of the present embodiment, it was also proved that an extremely high activation ratio of about 90% was achieved.

These results indicate that the method of the present embodiment allows a high activation ratio to be achieved, while retaining a flat surface. By contrast, it has been difficult to achieve both an improvement in activation ratio and the suppression of the occurrence of macro-steps by using the prior-art technology because, if the temperature for the activation annealing is increased, the activation ratio is increased but the macro-steps are also increased in size.

In addition, the method of the present embodiment can also prevent the degradation of the characteristics of the semiconductor device by an impurity material contained in a resist or the like because the impurity is not brought into the heating furnace for performing the activation annealing. Moreover, since the formation of the carbon layer 5 for suppressing the occurrence of the macro-steps can be performed in the same heating furnace in which the activation annealing is performed, it is unnecessary to introduce a new apparatus and the steps for fabricating the semiconductor device can be simplified. Since it is also possible to perform the removal of the carbon layer 5 in the same heating furnace in which the activation annealing is performed, the number of fabrication apparatus can be reduced and the fabrication steps can significantly be simplified compared with the case where the activation annealing and the removal of the carbon layer 5 are performed in different apparatus.

Although the method described in the present embodiment has continuously performed the annealing for forming the carbon layer and the activation annealing for the implanted ions in the same furnace, the same effects as achieved by the method of the present embodiment are also achievable if the individual steps are performed in different heating furnaces.

Although the method described in the present embodiment has continuously performed the activation annealing for the implanted ions and the removal of the carbon layer in the same furnace, the same effects as achieved by the method of the present embodiment are also achievable if the individual steps are performed in different heating furnaces.

Although the embodiment described above has removed the carbon layer by thermal oxidation, the same effects as achieved by the method of the present embodiment are also achievable if the carbon layer is removed by a plasma process or an ozone process using oxygen.

Although the embodiment described above has used 4H—SiC for the silicon carbide substrate, a silicon carbide substrate made of a polytype other than 4H—SiC may also be used instead.

Although an example described in the present embodiment has formed the carbon layer after the implantation of the p-type ions, the carbon layer can also be formed even when n-type ions are implanted in accordance with the same method as described in the example.

As shown in FIG. 1(d), the silicon carbide semiconductor device fabricated in accordance with the method described above comprises: the silicon carbide substrate 1; the silicon carbide thin film 2 with a thickness of 10 μm provided on the principal surface of the silicon carbide substrate 1; and the impurity doped layer 6 with a thickness of 4 μm provided in the silicon carbide thin film 2. In the impurity doped layer 6, a p-type impurity (aluminum or the like) at a concentration of, e.g., about $5\times10^{18}$ $cm^{-3}$ has been contained. The silicon carbide semiconductor device has electrodes and the like provided on, e.g., the impurity doped layer 6 and on the back surface of the silicon carbide substrate 1, though they are not depicted herein, and operates as a semiconductor device such as a transistor or a diode.

In the silicon carbide semiconductor device according to the present embodiment, extremely small level differences (steps) have been formed in the upper surface of the impurity doped layer 6 and the step height thereof is about not less than 0.1 nm and not more than 1 nm.

Accordingly, in the case with the device having a gate insulating film provided on the impurity doped layer, such as a vertical MOSFET, the gate insulating film can be formed to have a uniform thickness and the movement of carriers is not disturbed by macro-steps. This makes it becomes possible to increase the breakdown voltage and allow a current at a high density to flow, which will be described later. Since the activation ratio of the p-type impurity in the impurity doped layer 6 has become 80% or higher, the intrinsic characteristics of the semiconductor device can be improved compared with the case where the activation ratio is low.

Embodiment 2

As a second embodiment of the present invention, a silicon carbide MOSFET having a step height of 1 nm or less at the upper surface of the layer into which an impurity has been introduced, which is an example of the silicon carbide semiconductor device, and a method for fabricating the same will be described with reference to the drawings.

FIGS. 5(a) to 5(c) and FIGS. 6(a) to 6(c) are cross-sectional views illustrating the method for fabricating the silicon carbide MOSFET according to the present embodiment.

Figure 5A:
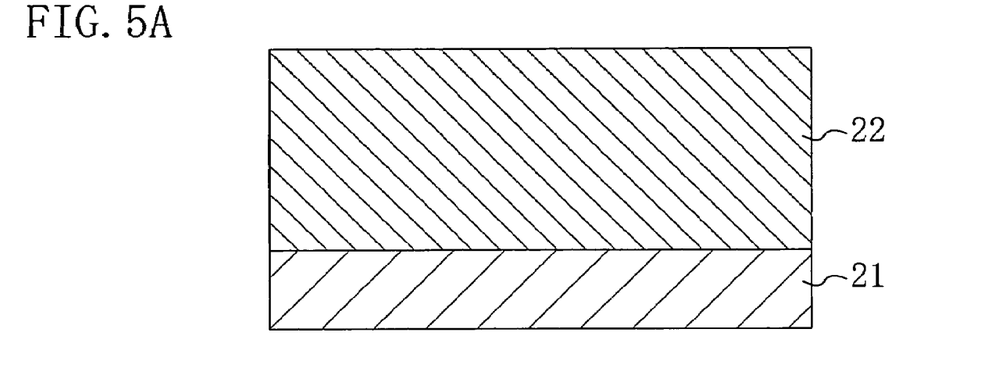
FIGS. 5(a) to 5(c) are cross-sectional views illustrating a method for fabricating a silicon carbide MOSFET according to a second embodiment of the present invention.

First, in the step shown in FIG. 5(a), a silicon carbide substrate 21 is prepared. As the silicon carbide substrate 21, there is used, e.g., a 4H—SiC substrate 1 having a principal surface thereof tilted at an off-angle of 8 degrees in the [11-20] (112-bar 0) direction from the (0001) plane and with a diameter of 50 mm. The substrate is of an n-type and the concentration of carriers therein is $1\times10^{18}$ $cm^{-3}$.

Next, an n-type impurity doped layer is grown epitaxially on the silicon carbide substrate 21 by CVD, whereby an n-type drift layer 22 with a thickness of 10 μm and at a carrier concentration of about $5\times10^{15}$ $cm^{-3}$ is formed on the silicon carbide substrate 21 of the MOSFET.

Figure 5B:
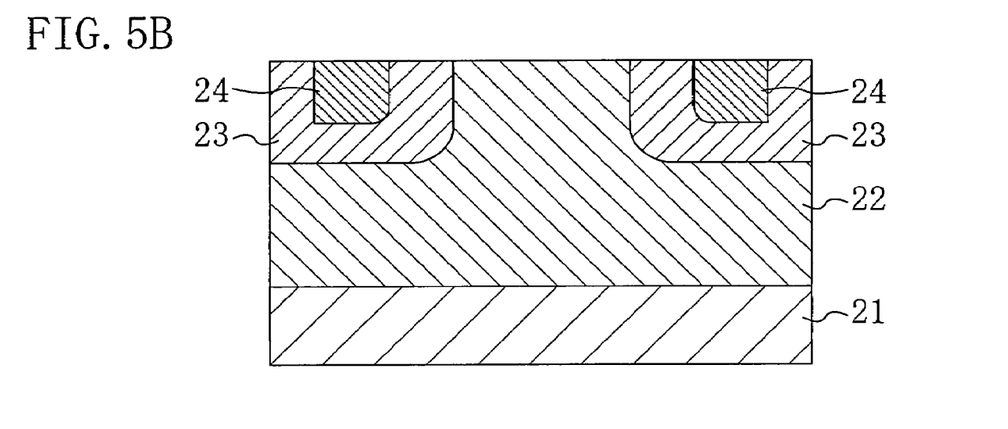

Next, in the step shown in FIG. 5(b), a first implant mask (not shown) composed of, e.g., a silicon dioxide film ($SiO_2$) is formed on the upper surface of the n-type drift layer 22 to form a first impurity implanted layer 23. The first implant mask covers a portion of the n-type drift layer 22 such that a region which will serve as the first ion implanted layer 23 later is opened. Then, Al ions are implanted into the n-type drift layer 22 from above the first implant mask. The conditions for the implantation of the Al ions are assumed to be the same as in the method according to the first embodiment.

Subsequently, the first implant mask is removed and then a second implant mask (not shown) made of $SiO_2$ is formed on the substrate such that a portion thereof is opened. Then, nitrogen ions are implanted into the first impurity ion implanted layer 23 through the opening of the second implant mask so that a second impurity ion implanted layer 24 is formed in the first impurity ion implanted layer 23.

Figure 5C:
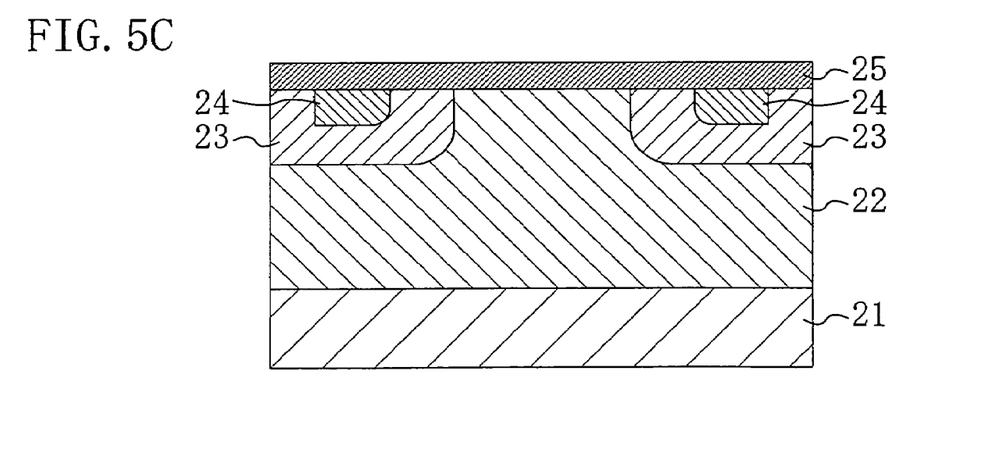

Next, in the step shown in FIG. 5(c), the substrate (the silicon carbide substrate 21 provided with the individual layers) is placed on the susceptor 152 in the annealing furnace and heated to 1250° C. in the state in which the chamber has been internally evacuated by using the gas exhaust system. In this state, annealing is performed for 180 minutes to form the carbon layer 25 with a thickness of about 100 nm.

Figure 6A:
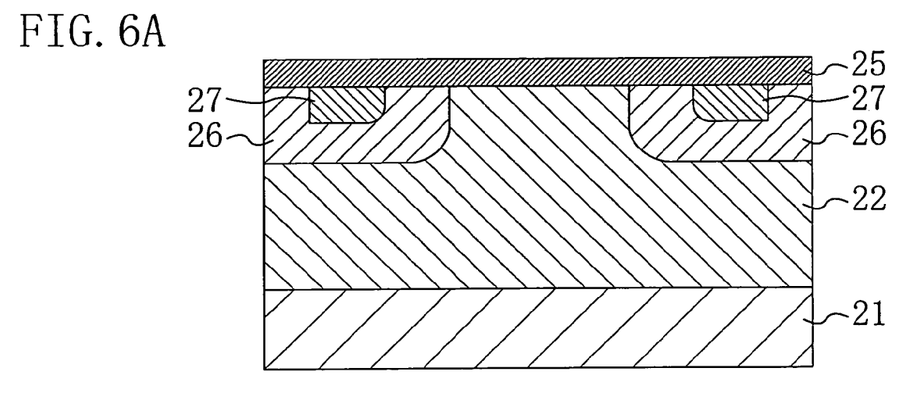
FIGS. 6(a) to 6(c) are cross-sectional views illustrating the method for fabricating the silicon carbide MOSFET according to the second embodiment.

Next, in the step shown in FIG. 6(a), an argon gas is supplied at a flow rate of 0.5 liters/minute, while the temperature of the substrate is held constant at 1250° C., to adjust the pressure in the chamber to 91 kPa. Thereafter, the substrate temperature is raised to 1750° C. and the activation annealing is performed for 30 minutes, while the temperature is maintained. As a result, the impurities contained in the first and second impurity ion implanted layers 23 and 24 are activated so that a p-type well region 26 and an n-type contact region for source 27 are formed. The activation ratio of the impurity in each of the p-type well region 26 and the n-type contact region for source 27 becomes 80% or more.

Figure 6B:
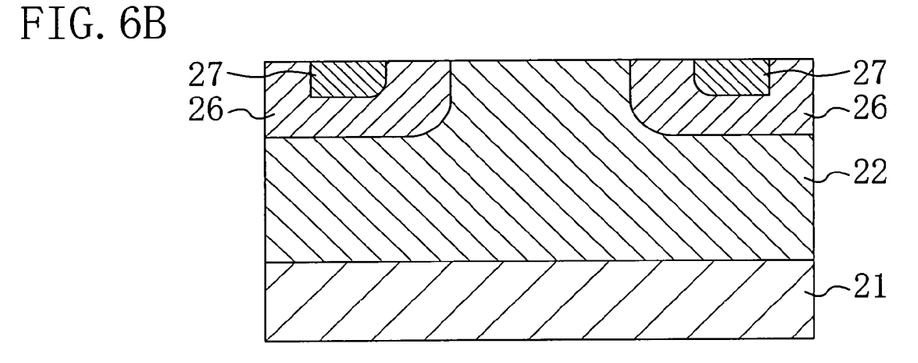

Subsequently, in the step shown in FIG. 6(b), a heating process for removing the carbon layer 25 is performed for 30 minutes by holding the substrate temperature in the chamber of the annealing furnace constant at 800° C. and supplying oxygen at a flow rate of 5 liters/minute. The process completely removes the carbon layer 25 provided over the silicon carbide substrate 21 and thereby exposes the p-type well region 26 and the contact region for source 27. The concentration of carriers contained in the p-type well region 26 is $1\times10^{17}$ $cm^{-3}$ and the n-type contact region for source 27 containing carriers at a concentration of $1\times10^{18}$ $cm^{-3}$ is formed. The height of each of steps formed in the respective upper surfaces of the p-type well region 26 and the contact region for source 27 after the activation annealing in this step is not less than 0.1 nm and not more than 1 nm so that the step height has been reduced to 1/10 or less of that in the case of using the conventional method.

Figure 6C:
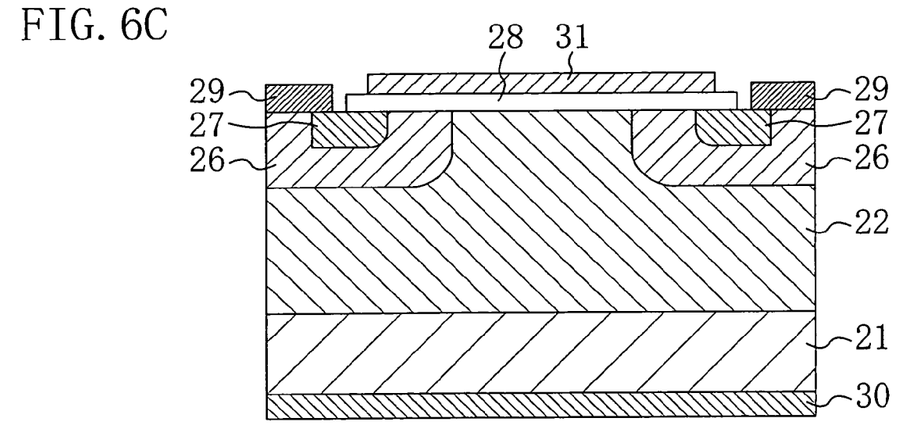

Next, in the step shown in FIG. 6(c), a gate insulating film 28 with a thickness of 30 nm is formed on the substrate surface by thermally oxidizing the substrate at 1100° C. Thereafter, Ni is deposited on the upper surface of the contact region for source 27 and on the back surface of the silicon carbide substrate 21 by using an electron beam (EB) vapor deposition apparatus. Subsequently, heating at 1000° C. is performed by using a heating furnace, thereby forming a source electrode 29 serving as a first ohmic electrode on the contact region for source 27 and forming a drain electrode 30 serving as a second ohmic electrode on the back surface of the silicon carbide substrate 21.

Then, a gate electrode 31 is formed by vapor depositing aluminum on the gate insulating film 28, whereby the MOSFET having a structure as shown in FIG. 6(c) is formed.

The MOSFET produced as described above comprises: the n-type silicon carbide substrate 21; the n-type drift layer 22 formed on the principal surface of the silicon carbide substrate 21; the p-type well region 26 provided in the n-type drift layer 22; the n-type contact region for source 27 provided in the p-type well region 26; the gate insulating film 28 provided over the n-type drift layer 22 and the p-type well region 26; the gate electrode 31 provided on the gate insulating film 28; the source electrode (ohmic electrode) 29 provided on the contact region for source 27; and the drain electrode 30 provided on the back surface of the silicon carbide substrate 21. The step height of steps formed in the respective upper surfaces of the p-type well region 26 and the contact region for source 27 is not less than 0.1 nm and not more than 1 nm. The step height of the steps formed in the upper surface of the n-type drift layer 22 is substantially uniform in each of the ion implanted region thereof and in the region thereof without ion implantation.

Next, the current-voltage characteristic of the MOSFET according to the present embodiment was measured to examine the performance thereof. A description will be given herein below to the result of the measurement.

For the sake of comparison, a MOSFET produced by performing activation annealing using the prior-art technology was prepared. The conditions for the prior-art activation annealing were such that the substrate temperature was 1750° C., the flow rate of the argon gas was 0.5 liters/minute, the pressure in the furnace during the annealing was held constant at 91 kPa, and the annealing time was 30 minutes. The MOSFET produced by using the prior art technology was designed to have the same device structure as the MOSFET according to the present embodiment.

As a result of measuring and making a comparison between the respective values of the drain currents during the operation of the MOSFET according to the present embodiment and during the operation of the conventional MOSFET, it was proved that the drain current in the MOSFET according to the present embodiment was triple or more the drain current in the MOSFET formed by using the prior art technology. A conceivable reason for this is that, since the step height (surface roughness) is 10 nm or more in the conventional MOSFET, the mobility of carriers flowing in the vicinity of the surface of the p-type well region 26 has lowered and the drain current has become less likely to flow. By contrast, since the step height in each of the p-type well region 26 and the contact region for source 27 is 1 nm or less in the MOSFET according to the present embodiment, it may be considered that the mobility of carriers has not lowered and the drain current at a high current density is allowed to flow.

The results shown above have proved that, by performing annealing in a reduced pressure atmosphere prior to the activation annealing process after ion implantation to form the carbon layer on the substrate surface and then continuously performing the activation annealing at a raised temperature, the high activation ratio can be achieved, while a flat surface is retained, and that the silicon carbide MOSFET with a surface roughness of 1 nm or less can be produced.

Although the present embodiment has described the MOSFET, the same effects are also obtainable from a MESFET in which a gate electrode forming a Schottky barrier with a silicon carbide thin film and source and drain electrodes each in ohmic contact with the silicon carbide thin film are further provided, a Schottky diode comprising a Schottky electrode provided on a silicon carbide thin film and an ohmic electrode provided on the back surface of the silicon carbide substrate, or the like.

Although the foregoing embodiment has described the inversion-type MOSFET, the same effects as obtained from the MOSFET according to the present embodiment are also obtainable from an accumulation-type MOSFET.

Although the description has thus been given to the MOSFET by way of example, the electric characteristics of even a silicon carbide semiconductor device other than the MOSFET fabricated by using an ion implantation technology can be improved by rendering the upper surface of the impurity doped layer more flat than in the conventional embodiment.

Other Embodiments

Besides the MOSFET described in the second embodiment, a Schottky diode, a MESFET, and the like are also fabricated by using an ion implantation technology so that the fabrication method according to the present invention is applicable thereto. A description will be given herein below to a method for reducing the size of each of macro-steps in these devices.

FIGS. 7(a) to 7(d) are cross-sectional views illustrating a method for fabricating a Schottky diode according to an embodiment of the present invention.

Figure 7A:
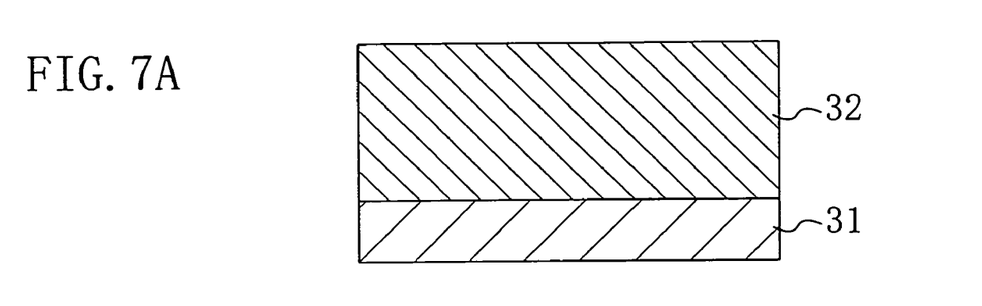
FIGS. 7(a) to 7(d) are cross-sectional views illustrating a method for fabricating a Schottky diode according to an embodiment of the present invention.

First, in the step shown in FIG. 7(a), an n-type epitaxially grown layer 32 with a thickness of 10 μm and at a carrier concentration of about $5\times10^{15}$ cm$^{-3}$ is formed by CVD on an n-type silicon carbide substrate 31. The concentration of carriers contained herein in the n-type silicon carbide substrate 31 is $1\times10^{18}$ cm$^{-3}$.

Figure 7B:
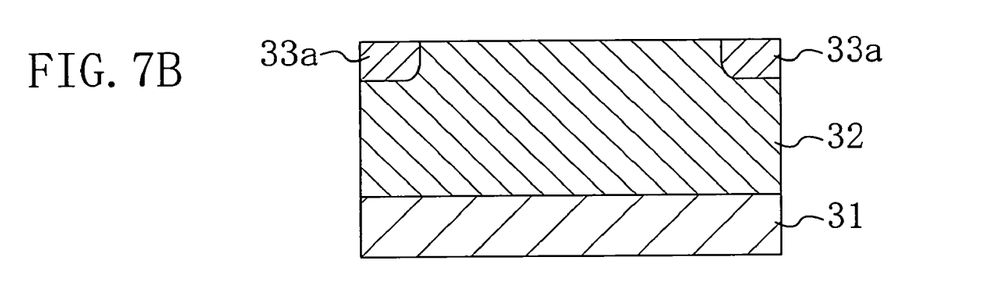

Next, in the step shown in FIG. 7(b), Al ions are implanted in parts of the epitaxially grown layer 32 to form guard rings 33a.

Figure 7C:
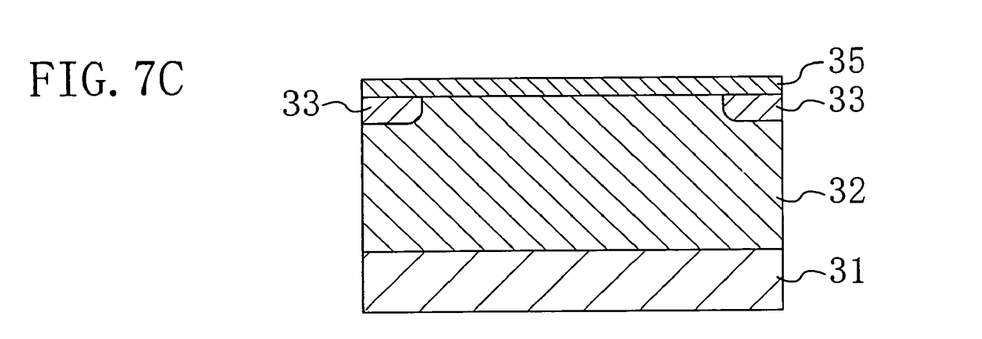

Next, in the step shown in FIG. 7(c), the substrate temperature is adjusted to 1250° C. and held constant for 180 minutes, whereby a carbon layer 35 with a thickness of 100 nm is formed on the substrate. Subsequently, the impurity in each of the guard rings 33a is activated by raising the substrate temperature to 1750° C. by using the same heating furnace as used in the annealing step so that guard rings 33 are formed.

Subsequently, in the step shown in FIG. 7(d), nickel is vapor deposited on the back surface of the n-type silicon carbide substrate 31 and heated at 1000° C. to form an ohmic electrode 39. Further, Ti (titanium) is vapor deposited on the upper surface of the epitaxially grown layer 32 to form a Schottky electrode 37.

Figure 7D:
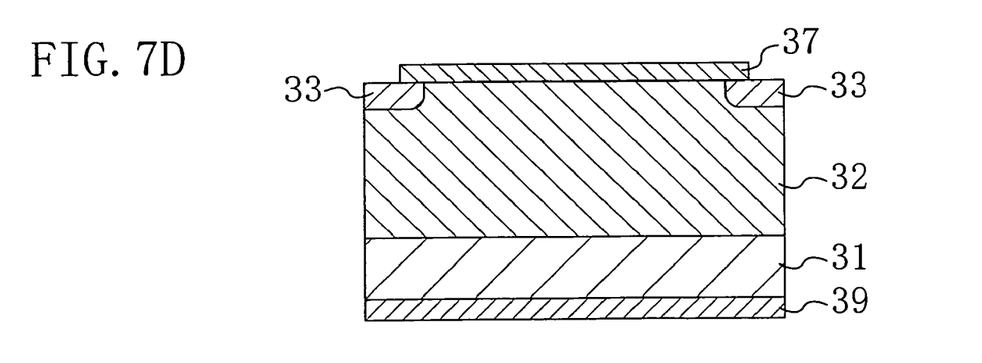

The Schottky diode thus fabricated comprises: the n-type silicon carbide substrate 31; the epitaxially grown layer 32 made of n-type SiC provided on the n-type silicon carbide substrate 31; the Schottky electrode made of Ti provided on the epitaxially grown layer 32; the guard rings 33 provided in the regions of the epitaxially grown layer 32 which are located under and on both sides of the Schottky electrode 37 and containing the p-type impurity; and the ohmic electrode 39 made of Ni provided on the back surface of the n-type silicon carbide substrate 31, as shown in FIG. 7(d).

By forming the carbon layer 35 in the step shown in FIG. 7(c) prior to the annealing process for activating the impurity, the step height at the upper surface of the epitaxially grown layer 32 of the Schottky diode according to the present embodiment has been reduced to a level not lower than 0.1 nm and not higher than 1 nm. In the Schottky diode according to the present embodiment, therefore, the localization of an electric field at the interface between the Schottky electrode 37 and the epitaxially grown layer 32 can be suppressed more effectively than in a conventional Schottky diode and the breakdown voltage can be increased.

Next, a description will be given also to a MESFET fabricated by using the method according to the present invention.

FIGS. 8(a) to 8(d) are cross-sectional views illustrating a method for fabricating an MESFET according to an embodiment of the present invention.

Figure 8A:
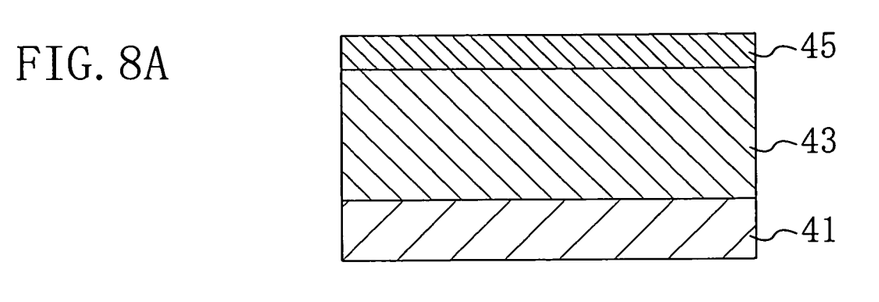
FIGS. 8(a) to 8(d) are cross-sectional views illustrating a method for fabricating a MOSFET according to an embodiment of the present invention.

First, in the step shown in FIG. 8(a), an undoped layer 43 made of silicon carbide with a thickness of 10 μm is grown by CVD on a silicon carbide substrate 41. Then, a channel layer 45 made of silicon carbide with a thickness of 200 nm and at a carrier concentration of about $5\times10^{17}$ cm$^{-3}$ is grown on the undoped layer 43.

Figure 8B:
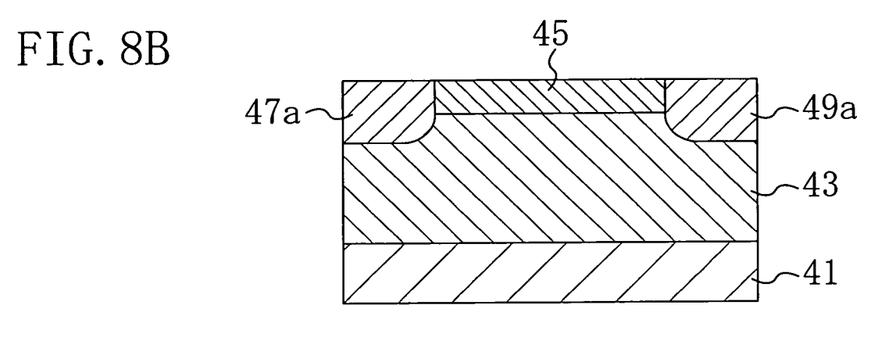
Figure 8C:
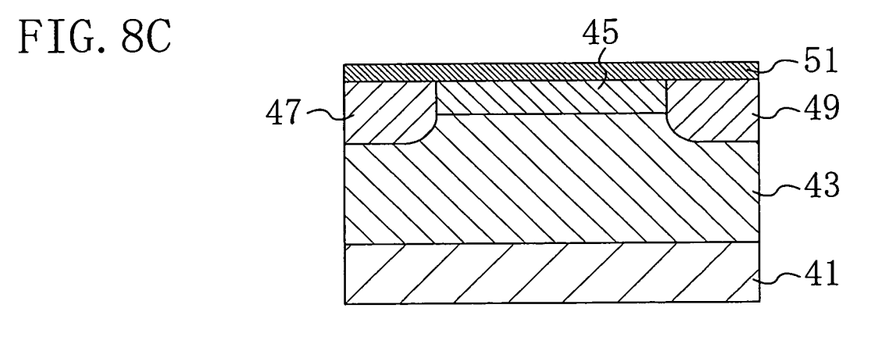

Next, in the step shown in FIG. 8(b), nitrogen ions are implanted in parts of each of the channel layer 45 and the undoped layer 43 to form a contact region for source 47a and a contact region for drain 49a such that the portion (the channel layer 45 shown in FIG. 8(c) and the subsequent drawings) of the channel layer 45 which is undoped with the impurity is sandwiched therebetween.

Then, as shown in FIG. 8(c), an annealing process at 1250° C. is performed with respect to the substrate for 180 minutes to form a carbon layer 51 with a thickness of 100 nm on the substrate. Subsequently, activation annealing is performed by raising the substrate temperature to 1750° C. by using the same heating furnace as used in the annealing step to form a source region 47 and a drain region 49.

Figure 8D:
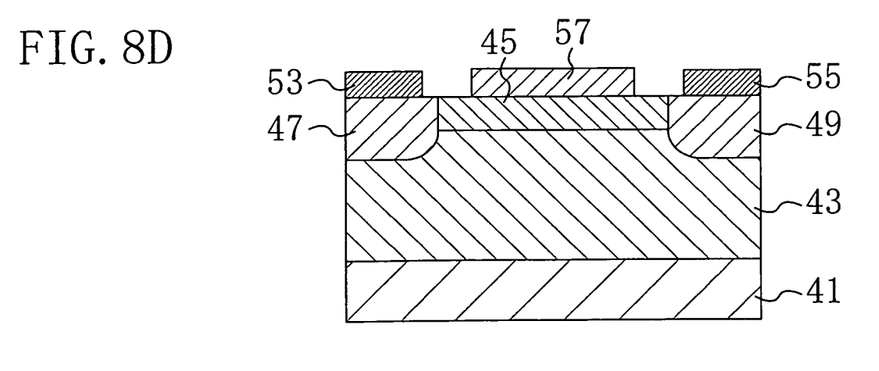

Thereafter, as shown in FIG. 8(d), Ni is deposited on the upper surface of each of the source region 47 and the drain region 49 and heated at 1000° C., thereby forming a source electrode 53 and a drain electrode 55. Further, Ti is vapor deposited on the upper surface of the channel layer 45 to form a gate electrode.

The MESFET thus fabricated according to the present embodiment comprises: the silicon carbide substrate 41; the undoped layer 43 made of undoped SiC with a thickness of 10 μm provided on the silicon carbide substrate 41; the channel layer 45 made of SiC containing the n-type impurity provided on the undoped layer 43; the gate electrode 57 provided on the channel layer 45; the source and drain regions 47 and 49 formed in the regions of the undoped layer 43 and the channel layer 45 which are located under and on both sides of the gate electrode 57; the source electrode 53 provided on the source region 47; and the drain electrode provided on the drain region 49.

In the MESFET according to the present embodiment, the step height at the upper surface of each of the source region 47, the drain region 49, and the channel layer 45 has been reduced to a level not lower than 0.1 nm and not higher than 1 nm. Consequently, in the MESFET according to the present embodiment, the disturbance of carriers has been suppressed more effectively than in a conventional MESFET and transconductance has been improved.

INDUSTRIAL APPLICABILITY

A silicon carbide semiconductor device according to the present invention is used preferably in a device required to operate at a high voltage, such as a plasma display.

What is claimed is:

1. A method for fabricating a silicon carbide semiconductor device, the method comprising the steps of:
    (a) implanting impurity ions into a silicon carbide layer;
    (b) heating the silicon carbide layer under a pressure condition lower than an atmospheric pressure to form a carbon layer on a surface of the silicon carbide layer; and
    (c) after the step (b), performing an activation annealing process with respect to the silicon carbide layer in an atmosphere at a temperature higher than in the step (b) and under a pressure condition higher than in the step (b).

2. The method of claim 1, wherein the steps (b) and (c) are performed in the same heating furnace.

3. The method of claim 1, wherein the step (b) includes forming the carbon layer in the presence of a gas containing hydrogen.

4. The method of claim 1, wherein the step (b) includes forming the carbon layer under a pressure condition not lower than $1\times10^{-5}$ Pa and not higher than 10 Pa.

5. The method of claim 1, wherein a temperature of the silicon carbide layer is not lower than 1100° C. and not higher than 1400° C. in the step (b).

6. The method of claim 1, wherein the step (c) includes performing the activation annealing process by adjusting a temperature of the silicon carbide layer to a range not lower than 1500° C. and not higher than 2000° C. under a pressure condition not lower than 1 kPa and not higher than 100 kPa.

7. The method of claim 1, further comprising the step of:
    (d) after the step (c), heating the silicon carbide layer in the presence of a gas containing oxygen atoms to remove the carbon layer.

8. The method of claim 7, wherein a temperature of the silicon carbide layer is not lower than 500° C. and not higher than 1000° C. in the step (d).

9. The method of claim 7, wherein the removal of the carbon layer in the step (d) is performed in the same heating furnace as the activation annealing process in the step (c).

* * * * *

UNITED STATES PATENT AND TRADEMARK OFFICE
CERTIFICATE OF CORRECTION

PATENT NO.          : 7,462,540 B2                                               Page 1 of 1
APPLICATION NO.     : 10/553845
DATED               : December 9, 2008
INVENTOR(S)         : Kunimasa Takahashi et al.

It is certified that error appears in the above-identified patent and that said Letters Patent is hereby corrected as shown below:

On the title page of the patent, under Item "(56) References Cited", under FOREIGN PATENT DOCUMENTS, delete "JP    2002-012482    1/2000"; and Change "JP    2002-089551    10/2002" to --JP    2002-289551    10/2002--.

Signed and Sealed this

Twenty-ninth Day of December, 2009

David J. Kappos
*Director of the United States Patent and Trademark Office*